US006753714B2

(12) United States Patent
Gupta

(10) Patent No.: US 6,753,714 B2
(45) Date of Patent: Jun. 22, 2004

(54) REDUCING POWER AND AREA CONSUMPTION OF GATED CLOCK ENABLED FLIP FLOPS

(75) Inventor: Sushil Kumar Gupta, Lucknow (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/274,923

(22) Filed: Oct. 22, 2002

(65) Prior Publication Data

US 2004/0075479 A1 Apr. 22, 2004

(51) Int. Cl.[7] .............................................. H03K 3/289
(52) U.S. Cl. ...................................... 327/202; 327/203
(58) Field of Search ............................... 327/202, 203, 327/208, 211, 218, 225, 197

(56) References Cited

U.S. PATENT DOCUMENTS

| 4,181,862 A | * | 1/1980 | Dingwall ..................... 377/117 |
| 5,345,109 A | * | 9/1994 | Mehta ......................... 327/115 |
| 5,719,878 A | * | 2/1998 | Yu et al. ...................... 714/726 |
| 2002/0180503 A1 | * | 12/2002 | Lu ............................... 327/203 |

OTHER PUBLICATIONS

Tomas Lang, Enric Musoll and Jordi Cortadella; Entitled: "Individual Flip–Flops with Gated Clocks for Low Power Datapaths"; IEEE Transactions on Circuits and Systems–II: Analog and Digital Signal Processing, vol. 44, No. 6, Jun. 1997; pp.: 507–516; (10 Pages).

A.G.M. Strollo and D. De Caro; Entitled: "Low Power Flip Flop with Clock Gating on Master and Slav Latches"; Electronic Letters; vol.: 36, No.: 4; 17th Feb. 2000; pp.: 294–295; (2 Pages).

Qing Wu, Massoud Pedram, and Xunwei Wu; Entitled: "Clock–Gating and Its Application to Low Pow r D sign of Sequential Circuits"; IEEE Transactions on Circuits and Systems–I: Fundamental Theory and Applications, vol. 47, No.:103, Mar. 2000; pp.: 415–420; (6 Pages).

Neil H. E. Weste and Kamran Eshraghian; Entitled: "Principles of CMOS VLSI Design A Syst ms Perspective"; Second Edition; pp.: xi–xxii; 9–13; 19–21; 303–305; 318–325; (33 Pages).

* cited by examiner

Primary Examiner—Linh M. Nguyen
(74) Attorney, Agent, or Firm—Alan K. Stewart; W. James Brady, III; Frederick J. Telecky, Jr.

(57) ABSTRACT

A master latch implemented to receive feedback from a slave latch on a different input terminal than a input terminal on which data bits are received. Due to such receiving, the number of transistors/area and/or power consumption requirements (efficiently) may be minimized in implementing a flip-flop. The feedback path may be implemented using a single pass-gate, further enhancing the efficiency of implementation. In addition, clock enable/disable signals may be generated efficiently taking into account an externally received flip-flop disable signal and absence of transitions in the data input bits. When the flip-flop is implemented to support ATPG type sequential scanning testing, a multiplexor may be implemented efficiently to select either the data bits or scan bits.

13 Claims, 2 Drawing Sheets

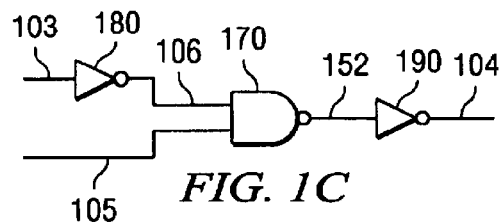
FIG. 1C
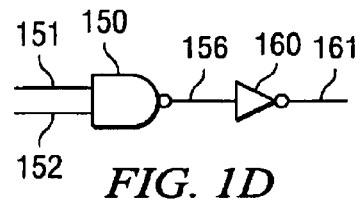
FIG. 1D
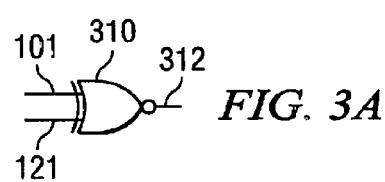
FIG. 3A
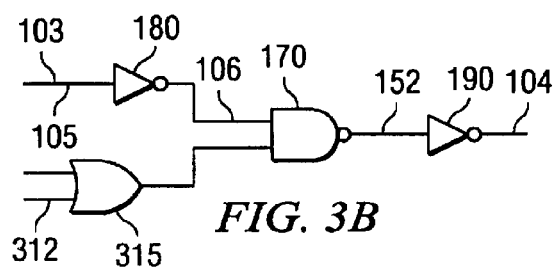
FIG. 3B
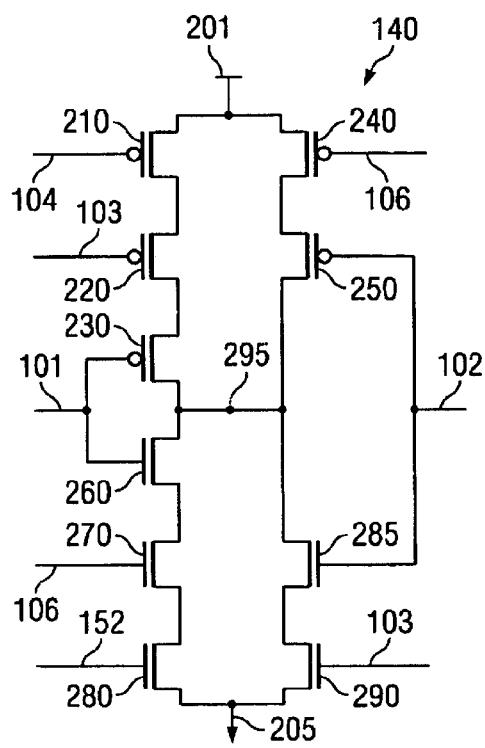
FIG. 2
FIG. 3C

REDUCING POWER AND AREA CONSUMPTION OF GATED CLOCK ENABLED FLIP FLOPS

BACKGROUND OF THE INVENTION

FIELD OF THE INVENTION

The present invention relates to design of integrated circuits, and more specifically to a method and apparatus for reducing power and area consumption of gated clock enabled flip-flops.

BRIEF DESCRIPTION OF THE DRAWINGS

The present invention will be described with reference to the accompanying drawings, wherein:

FIG. 1C is a circuit diagram illustrating the manner in which clock enable and disable signals can be generated using a flip-flop disable signal and a scan signal (which indicates whether the flip-flop is presently supporting a scan mode);

FIG. 1D is a circuit diagram of a clock generation circuit illustrating the manner in which various internal clock signals may be generated (in a flip-flop) using the clock enable and disable signals;

FIG. 2 is a circuit diagram illustrating the manner in which a multiplexor can be implemented to select either a scan data or a data (D) input according to an aspect of the present invention;

FIG. 3A is a circuit diagram illustrating the manner in which a signal can be generated to indicate whether a clock is to be enabled or disabled taking into account both the flip-flop disable signal and absence of transition in a data (D) input stream;

FIG. 3B is a circuit diagram illustrating the manner in which the circuit diagram of FIG. 1C may need to be modified to generate clock enable/disable signals taking into account the absence of transitions in a data (D) input stream; and FIG. 3C is a circuit diagram illustrating the details of a transistor level implementation of a circuit which generates clock enable/disable signals taking into account both the flip-flop disable signal and absence of transition in a data (D) input stream.

In addition, in the drawings, like reference numbers generally indicate identical, functionally similar, and/or structurally similar elements. The drawing in which an element first appears is indicated by the leftmost digit(s) in the corresponding reference number.

DETAILED DESCRIPTION OF THE PREFERRED EMBODIMENTS

Figure 1A:
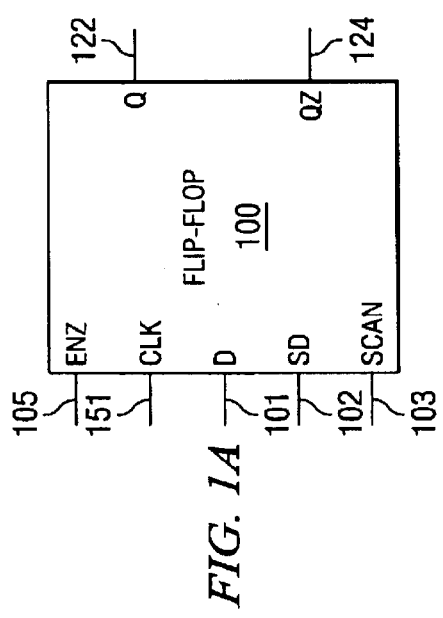
FIG. 1A is a block diagram illustrating the general operation of an embodiment of a scan flip-flop implemented according to an aspect of the present invention.

1. Overview and Discussion of the Invention

An aspect of the present invention enables a flipflop to be implemented with a clock gating circuit while reducing the number of transistors and power consumption requirements. As is well known, a clock gating circuit generally refers to a circuit which prevents a flip-flop from receiving clock signal transitions when not needed. For example, a flip-flop may receive a disable signal during a certain duration, and it may not be necessary to provide a clock signal during such duration. By not providing the clock signal transitions, the power consumption is generally reduced.

The advantage(s) may be achieved by using a feedback circuit which feeds back an output generated by a slave latch as an input to a master latch. The master latch may receive the feedback data bits and the data (D) input bits on different paths such that a multiplexor is not required to receive one of the two types of bits. By receiving the feedback bits directly (for example, instead of through a multiplexor selecting either the data bits or the feedback bits), the number of transistors required to implement a flip-flop may be minimized.

In addition, in the normal mode (flip-flop is enabled and transferring each received bit to output) of operation, the setup and hold times of a gated clock enabled flip-flop implemented according to various aspects of the present invention may respectively substantially equal the setup and hold times of a non-gated flip flop due to the absence of such components in the path of the data bits for the purpose of providing feedback.

According to another aspect of the present invention, the feedback path may contain a single pass-gate, which further potentially reduces the number of transistors and power consumption requirements (in comparison to several prior embodiments)

One more aspect of the present invention enables clock disable/enable signals taking into account a flipflop disable signal (received externally) and transitions in input data, while further potentially reducing the number of transistors and power consumption requirements.

Another aspect of the present invention enables a multiplexor circuit to be implemented to select either data input or a scan input depending on whether the flip-flop is in a scan mode and whether the clock enable signal is asserted. The multiplexor circuit may also be implemented while further potentially reducing the number of transistors and power consumption requirements.

Several aspects of the invention are described below with reference to examples for illustration. It should be understood that numerous specific details, relationships, and methods are set forth to provide a full understanding of the invention. One skilled in the relevant art, however, will readily recognize that the invention can be practiced without one or more of the specific details, or with other methods, etc. In other instances, well-known structures or operations are not shown in detail to avoid obscuring the invention.

2. Flip-flop

FIG. 1A through 1D are diagrams together illustrating the details of a clock gated enabled flip-flop 100 according to an aspect of the present invention. For illustration, the flip-flop is described implemented as a scan flip-flop, which may be used in the testing of integrated circuits. However, the present invention may be implemented in several other types of flip-flop as well.

FIG. 1A is a block diagram illustrating the general operation of clock gated enabled scan flip-flop 100. Flip-flop 100 selects either the D (input) input 101 or SD (scan data) input 102, and provides the selected signal on path Q 122. QZ 124 represents the complement of Q 122. When SCAN 103 is asserted, the flip-flop is in a test mode (e.g., using ATPG technique), in which SD 102 is selected. On the other hand, when SCAN input 103 is not asserted, D 101 is selected at time points specified by flip-flop input clock 151 only when ENZ 105 ("flip-flop disable signal") is low.

By using ENZ 105, signal transitions may be prevented within flip-flop 100, thereby reducing electrical power consumption. The present invention enables the consumption to be reduced potentially further.

Figure 1B:
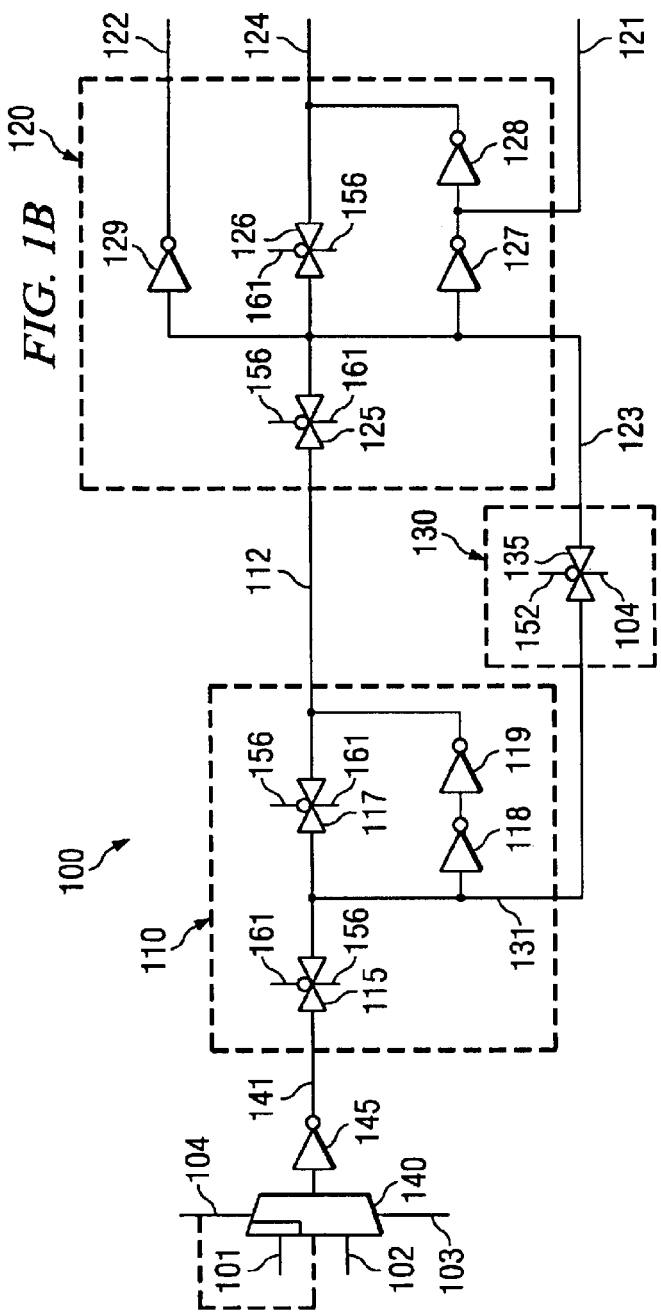
FIG. 1B is a circuit diagram illustrating the further details of an embodiment of scan-flip-flop according to an aspect of the present invention.

Continuing with reference to FIG. 1B, an embodiment of flip-flop 100 is shown containing master latch 110, slave latch 120, clock gating circuit 130, multiplexer-inverter 140 and inverter 145. Each component is described below.

Multiplexer-inverter 140 selects either input data D 101 or scan data SD 102, and generates an inverted version of the selected data as an input to inverter 145. The selection of the specific input is controlled by SCAN 103 and ENZZ 104 (clock disable signal). As may be appreciated readily from FIG. 1C (described in a section below), ENZZ 104 represents ENZ signal 105 passed through when SCAN 103 is low (i.e., not in test mode).

SD 102 (or a bit presented on SD 102) is selected when SCAN 103 is high irrespective of the logical value on ENZZ 104. Input data D 101 is selected when SCAN 103 and ENZZ 104 are at logic low. Thus, in a testing mode, the scan data received on SD 102 is selected. When not in testing mode, the input data received on D 101 is selected only when the enable signal ENZZ 104 is at a logic low.

Inverter 145 inverts the output of multiplexer-inverter 140 and provides the inverted output on path 141. It may thus be appreciated that multiplexer-inverter 140 and inverter 145 together operate as a multiplexor of signals D 101 and SD 102. In addition, inverter 145 acts as a buffer between multiplexor-inverter 140 and pass gate 115 to reduce propagation delay and setup time of D 101 or SD 102. An embodiment of multiplexer-inverter 140 is described below with reference to FIG. 2. The manner in which ENZZ 104 may be generated is described in a section below with reference to FIG. 1C.

Master latch 110 receives input signal on path 141 and provides the same signal on path 112 in a master latch enabled state. A master latch enabled state is present when CKB 161 is at logic low and CKZ 156 is at logic high. The manner in which the two signals 156 and 161 may be generated, is described below with reference to FIG. 1D. From the description there, it may be appreciated that master latch enabled state is present during half cycle of flip-flop input clock 151 when ENZ 105 is low.

Master latch 110 is shown containing pass gates 115 and 117, and inverters 118 and 119. Pass gate 115 is closed when CKB 161 is at logic low and CKZ 156 is at logic high since the gate terminals of PMOS and NMOS transistors (transistors not shown) are respectively coupled to CKB 161 and CKZ 156. In the closed state, pass gate 115 passes the signal received on path 141, and the passed signal is further propagated through inverters 118 and 119 to slave latch 120. In the same duration, pass gate 117 is open.

Pass gate 115 is open when CKB 161 is at logic high and CKZ 156 is at logic low. In the same duration, pass gate 117 is closed. The combination inverters 118 and 119, and pass gate 117 operate to hold the previous data which was transferred when CKB 161 was at logic low.

Master latch 110 is further shown receiving feedback data on path 131 and the data bits of D 101 (assuming SCAN 103 is low) on path 141. By receiving the two types of data on two different paths, flip-flop 100 can be implemented without requiring a multiplexor for receiving the two data signals on a common path. Absence of the multiplexer generally leads to the reduction in number of transistors and power consumption requirements.

Slave latch 120 receives input signal on path 112 and provides the outputs Q and NQ respectively on paths 122 and 121 in a slave latch enabled state. As may be appreciated, NQ represents an internal node which has been used for clock gating when the input data is not switching (changing). A slave latch enabled state is present when CKB 161 is at logic (logical) high and CKZ 156 is at logic low. It may be further appreciated that the slave latch enabled state is present during one half of flip-flop input clock 151 and the master latch enabled state is present in the other half when ENZ 105 is low.

Slave latch 120 is shown containing pass gates 125 and 126, and inverters 127 and 128. Pass gate 125 is in a closed state when CKB 161 is at logic high and CKZ 156 is at logic low since the gate terminal of the NMOS and PMOS transistors (transistors not shown) are respectively coupled to CKB 161 and CKZ 156. In the closed state, the input signal on path 112 is passed through each of inverters 127 and 129 to generate output NQ on path 121 and Q on path 122 respectively. Inverter 128 inverts NQ 121 to generate QZ 124.

Pass gate 125 is open when CKB 161 is at logic low and CKZ 156 is at logic high. In the same duration, pass gate 126 is closed. The combination inverters 127 and 128, and pass gate 126 operate to hold the previous data which was transferred when CLKB 161 was at logic high.

Therefore, master latch 110 receives signal on path 141 and provides the same signal to slave latch 120 on path 112 when CKB 161 is at logic low. Slave latch 120 provides the received signal on path 112 as output Q on path 122 when CKB 161 is at logic high. Thus, master latch 110 and slave latch 120 together operate to provide a signal received on path 141 as output Q on path 122 in one cycle of CKB 161.

Clock gating circuit 130 ensures that the output of master latch 110 is the same as the output of slave latch 120 when EN 152 (clock enable signal) is at a logic low (i.e., flip-flop 100 is disabled). Such a result may be achieved by feeding back the value stored in slave latch 120 as an input to inverter 118 in master latch 110. Due to such a feedback path, unwanted glitches may be avoided on Q 122 when ENZ 105 goes from a logic high to logic low state as described below (after description of clock gating circuit 130).

Clock gating circuit 130 is shown containing pass gate 135. Pass gate 135 is in a closed state when EN 152 is low and ENZZ 104 is high (since the gate terminals of PMOS and NMOS transistors are respectively coupled to EN 152 and ENZZ 104), or else pass gate 135 is in a opened state. Pass gate 135 receives input from slave latch 120 on path 123 and the output is connected to master latch 110 by path 131.

When pass gate 135 is in the open state, the signal on path 123 is not provided on path 131.When EN 152 is low, pass gate 135 is in the closed state and the signal from slave latch 120 on path 123 is provided to master latch 110. Thus, master latch 110 and slave latch 120 store the same logical values when EN 152 is low (ENZ 105 high).

In operation, when EN 152 changes from logic low to logic high, NAND gate 150 (of FIG. 1D, described below) may transfer unwanted (spurious) clock transition of CLK 151 to master latch 110 and slave latch 120. Due to the unwanted transitions of CLK 151, the signal on path 141 may be transferred to output Q on path 122. Since, master latch 110 and slave latch 120 have the same values before EN 152 changes from logic low to high, output Q may not make a transition due to the unwanted clock signal. Thus, clock gating circuit 130 avoids undesirable transition at output Q which may otherwise result due to unwanted clock transitions.

Thus, when ENZZ 104 is at logic low (EN 152 is high), pass gate 135 is in the open state, thereby not providing any feedback to master latch 110. In addition, the signal on path 141 is transferred to output Q in a clock cycle of CLK 151, as required for the operation of a flip-flop in an enabled state.

On the other hand, when ENZZ 104 is high (EN 152 is low), CKB 161 and CKZ 156 may respectively remain at logical low and logical high respectively, and pass gate 135 is in the closed state. As the value on path 123 is passed in the closed state, master latch 110 and slave latch 120 may store the same logic value to avoid undesired transition at output Q.

Thus, the implementation of above ensures that no transitions are present on CKB 161 and CKZ 156 when ENZZ 104 is at logical high. Absence of transitions on CKB 161 and CKZ 156 signals, generally reduces power consumption within flip-flop 100. In addition, the number of components/space may also be reduced as clock gating circuit 130 may be implemented with a single pass gate without using components such as a latch or multiplexer. The description is continued with respect to the manner in which CKB 161 (and CKZ 156) may be generated.

3. CKB, CKZ, EN, and ENZZ Signals

FIG. 1D is a circuit diagram of a clock generation circuit illustrating the manner in which signals CKB 161 and CKZ 156 are generated in an embodiment of the present invention. The circuit is shown containing NAND gate 150 and inverter 160 connected in series. NAND gate 150 is shown receiving CLK 151 and EN 152 signals as input. The output of NAND gate 150 represents CKZ 156 and the output of inverter 160 represents CKB 161.

Thus, CKB 161 and CKZ 156 are complement to each other and derived from CLK signal 151 when EN 152 is at a logic high. In addition, CLK 151 is transferred (as CKB and CKZ signals) when EN 152 is at logic high, else CLK 151 is blocked. The description is continued with respect to an example embodiment which generates ENZZ 104 and EN 152.

FIG. 1C contains an example circuit diagram (also part of the clock generation circuit) which can be used to generate ENZZ 104 and EN 152. The circuit is shown containing NAND gate 170, and inverters 180 and 190. Inverter 180 inverts SCAN 103 to generate SCANZ 106. NAND gate 170 performs a logical NAND operation on SCANZ 106 and ENZ 105 to generate EN 152. Inverter 190 inverts EN 152 to generate ENZZ 104.

Thus, ENZZ 104 represents ENZ 105 when SCAN 103 is at logical low (i.e., when testing is not performed). EN 152 represents an inverted version of ENZ 105. The description is continued with respect to an example of embodiment of multiplexor-inverter 140.

4. Multiplexer-Inverter

FIG. 2 is a circuit diagram illustrating the details of multiplexer-inverter 140 in an embodiment of the present invention. Multiplexer-inverter 140 receives two select signals, ENZZ 104 and SCAN 103, and two data inputs D 101 and SD 102. Multiplexer-inverter 140 selects either D 101 or SD 102 depending on ENZZ 104 and SCAN 103. Multiplexer-inverter 140 selects SD 102 when SCAN 103 is high, irrespective of the value of ENZZ 104. Multiplexer-inverter 140 selects D101 when SCAN 103 and ENZZ 104 are low. Multiplexer-inverter 140 may not select either D 101 or SD 102 (and thus in high impedance state) when SCAN 103 is low and ENZZ 104 is high. Thus, multiplexer-inverter 140 may operate in three different cases and the operation of each component in the three cases is described below.

Multiplexer-inverter 140 is shown containing PMOS transistors 210, 220, 230, 240, and 250, and NMOS transistors 260, 270, 280, 285 and 290. The gate terminal of transistors 210, 220, 230, 240,250, 260, 270,280,285 and 290 is respectively connected to ENZZ 104, SCAN 103, D 101, SCANZ 106, SD 102, D 101, SCANZ 106, EN 152, SD 102, and SCAN 103. The source terminals of transistors 210 and 240 are connected to $V_{CC}$ 201. The source terminals of transistors 280 and 290 are connected to $V_{SS}$ 205.

The source terminal and drain terminal of transistor 220 are respectively connected to drain terminal of transistor 210 and source terminal of transistor 230. The source terminal and drain terminal of transistor 260 are respectively connected to drain terminal of transistor 270 and drain terminal of transistor 230. The drain terminal of transistor 280 is connected to the source terminal of transistor 270.

The source terminal and drain terminal of transistor 250 are respectively connected to drain terminal of transistor 240 and drain terminal of transistor 285. The drain terminal of transistor 290 is connected to the source terminal of transistor 285. The drain terminals of transistors 230 and 250, and the drain terminals of transistors 260 and 285 are all connected at node 295 (which is connected to inverter 145 of FIG. 1B, not shown here). The manner in which the circuit thus provided operates in the three cases (noted above), is described below.

As noted above, in the first case, when SCAN 103 is high and ENZZ 104 may be any value, which causes SD 102 to be selected. When SCAN 103 is high, SCANZ 106 is low and hence transistors 220 and 270 are turned off. The off state causes transistors 230 and 260 to be disconnected from VCC 201 and VSS 205, and thus D 101 may not be selected. At the same time, transistors 240 and 290 are on. The on state causes the drain terminal of transistor 250 to be connected to VCC 201 and the source terminal of transistor 285 to be connected to VSS 205. As a result, transistors 250 and 285 operate as an inverter and provide the inverted SD 102 on node 295.

In the second case, SCAN 103 and ENZZ 104 are low, which causes D 101 to be selected. When SCAN 103 is low, transistors 240 and 290 are turned off. The off state causes transistors 250 and 285 to be disconnected from VCC 201 and VSS 205, and thus SD 102 may not be selected. At the same time when SCAN 103 and ENZZ 104 are low, transistors 210, 220, 270 and 280 are on. The on state causes transistor 230 to be connected to VCC 201 and transistor 260 to be connected to VSS 205. Transistors 230 and 260 may provide inverted signal of D 101 on path 295.

In the third case, SCAN 103 is low and ENZZ 104 is high, in which case neither D 101 nor SD 102 is selected, and multiplexor-inverter 140 operates as tri-state buffer. In the tri-state, the D input 101 is not passed to master latch 110. As a result, race-condition (in terms of input to master latch 110) may be avoided between present data (received on D 101) and previous data (received from slave latch 120) when ENZZ 104 is high.

When SCAN 103 is low, transistors 240 and 290 are turned off. The off state causes transistors 250 and 285 to be disconnected from VCC 201 and VSS 205, and thus SD 102 may not be selected. At the same time when ENZZ 104 is high, transistors 220 and 280 are turned off. The off state causes transistor 230 to be disconnected from VCC 201 and transistor 260 to be disconnected from VSS 205and thus D 101 is also not selected.

A conventional multiplexer may be implemented with one select signal and which may need 8 to 10 transistors. To implement multiplexing operation with two select signals, two conventional multiplexers may be necessary in an embodiment, which may require 16 to 20 transistors. However, multiplexer-inverter 140 may be implemented with two select signals and require only 10 transistors and thus may farther reduce the area requirement and power consumption of gated clock enabled flip-flop 100.

In an embodiment, each of pass gates 115, 117, 125, 126 and 135, and inverters 145, 118, 119, 127, 128, 129, 180, 190, and 160 in flip-flop 100 is implemented with two transistors. NAND gates 170 and 150 are implemented with four transistors. As noted above, multiplexer-inverter 140 may be implemented with only 10 transistors. As a result, flip-flop 100 may be implemented with a reduced number of transistors compared to several prior art implementations.

In the above description, gated clock enabled flip-flop 100 is shown providing clock gating only when ENZ 105 is high, which reduced power consumption. In addition, clock gating may be necessary when input to flipflop 100 is constant (not changing). The manner in which clock gating may be performed in such situations is described below with reference to FIGS. 3A and 3B:

4. Clock Gating When Input Data Does Not Change

FIGS. 3A and 3B are circuit diagrams together illustrating the manner in which clock gating may be implemented when the input data does not change in an embodiment of the present invention. During such time, output Q of a flip-flop may also be constant and hence the flip-flop may be disabled from processing new input data and clock signal CLK 151.

According to an aspect of the present invention, such disabling is achieved by merely changing the manner in which ENZZ 104 is generated. All the other components of flip-flop 100 may be the same as described in the above section. Thus, in the interest of conciseness, the manner in which ENZZ 104 may be generated to achieve clock gating when input data does not change is only described below.

FIG. 3A is shown containing XNOR gate 310, which receives D 101 and NQ 121 as inputs and provides output Y 312. As noted above, NQ 121 represents the present output or previous data. When flip-flop is driving a heavy load at node Q 122, data arrival at NQ 121 may not be affected by load at Q 122. Thus, the steady state values at Y 312 may be obtained without delays due to load at Q 122.

XNOR gate 310 provides a logic high at output Y when both present data D 101 and previous data NQ 121 are the same, which means input data D 101 is constant. Therefore, when output Y is high, CLK 151 may need to be blocked even if ENZZ 104 is low.

FIG. 3B is a circuit diagram illustrating the manner in which the diagram of FIG. 1C can be extended using Y 312 to achieve clock gating when the input data does not change. The description of components already present in FIG. 1C is not repeated in the interest of conciseness. Thus, OR gate 315 is shown receiving ENZ 105 and Y 312 as inputs, and the resulting output is as an input to NAND gate 170. The results of operation of the circuit of FIG. 3B are described below with reference to FIG. 3C.

FIG. 3C is a circuit diagram illustrating the details of ENZZ 104 signal generation in an embodiment of the present invention. FIG. 3C is shown containing PMOS transistors 320, 330 and 360, NMOS transistors 340, 350 and 370, and inverter 380. The source terminals of transistors 320 and 360 are connected to $V_{CC}$ (supply). The source terminal of transistor 350 is connected to $V_{SS}$ (ground).

The source and drain terminals of transistor 330 are respectively connected to drain terminal of transistor 320 and drain terminal of transistor 340. The drain terminal of transistor 350 is connected to the source terminals of both transistors 340 and 370. The drain terminal of transistor 370 is connected to drain terminal of transistor 360. In addition, the drain terminals of transistors 330 and 360, and the drain terminals of transistors 340 and 370 are connected to EN 152.

As described below, the circuit operates to pass ENZ 105 only when SCANZ 106 is high and Y 312 equals logical low (0) ("scenario 1"). On the other hand, if Y 312 equals logical high and SCANZ 106 is high ("scenario 2"), a logical high signal is generated for ENZZ 104. When SCANZ 106 is low ("scenario 3"), a logical low signal is generated for ENZZ 104, irrespective of the values of Y 312 and ENZ 105. The operation of the circuit in the three scenarios is described below in further detail.

In scenario 1, PMOS transistor 360 is turned off and NMOS transistor 350 is turned on as SCANZ 106 is at a logical high. PMOS transistor 320 is turned on and NMOS transistor 340 is turned off as Y 312 is at logical low. As a result, transistors 330 and 340 together operate as an inverter, inverting ENZ 105 to generate EN 152. Inverter 380 further inverts EN 152 to generate ENZZ 104, as desired.

In scenario 2, PMOS transistor 360 is turned off and NMOS transistor 350 is turned on as SCANZ 106 is at a logical high. PMOS transistor 320 is turned off and NMOS transistor 340 is turned on as Y 312 is at logical high. As transistors 350 and 370 are turned on (and connected to ground at one end), EN 152 equals logical low. Inverter 380 inverts EN 152 to generate ENZZ 104 at a logical high, as desired.

In scenario 3, PMOS transistor 360 is turned on and NMOS transistor 350 is turned off as SCANZ 106 is at a logical low. As PMOS transistor 360 is turned on, EN 152 is connected to supply voltage, and thus equals logical high. ENZZ 104 would be at a logical low due to the inversion operation of inverter 380, as desired.

Due to the various approaches employed above, the number of transistors and power consumption requirements may be reduced in comparison to several prior flip-flop circuits implementing clock gating.

5. Conclusion

While various embodiments of the present invention have been described above, it should be understood that they have been presented by way of example only, and not limitation. Thus, the breadth and scope of the present invention should not be limited by any if the above described exemplary embodiments, but should be defined only in accordance with the following claims and their equivalents.

What is claimed is:

1. A flip-flop receiving a data (D) input and a clock (CLK) input, said flip-flop comprising:

a master latch receiving said D input and a feedback input on a first path and a second path respectively, said master latch generating a first output when clocked;

a slave latch being coupled to receive said first output, said slave latch generating a second output when clocked;

a clock generation circuit clocking said master latch and said slave latch based on said CLK input, said clock generation circuit controlling said master latch and said slave latch such that said master latch and said slave latch do not have internal transitions due to clocking when said flip-flop is to be disabled;

a feedback circuit providing said second output as said feedback input on said second path when said flip-flop is disabled;

wherein said feedback circuit comprises only a first pass gate such that a number of transistors contained in said flip-flop are minimized;

wherein said flip-flop further receives a disable (ENZ) input, wherein said ENZ input indicates whether said flip-flop is presently enabled or disabled, wherein said ENZ signal is provided to said clock generation circuit; and wherein said clock generation circuit generates a clock enable signal (EN) having a logical high when said flip-flop is to be enabled, and a clock disable signal (ENZZ) having a logical high when said flip-flop is to be disabled, wherein said clock generation circuit further generates a CKB signal by performing an AND logical operation of said EN signal and said CLK signal, said clock generation circuit generating a CKZ signal which is a logical inversion of said CKB signal.

2. The flip-flop of claim 1, wherein a gate terminal of a PMOS transistor of said first pass gate is coupled to said EN signal and a gate terminal of an NMOS transistor of said first pass gate is coupled to said ENZZ.

3. The flip-flop of claim 2, wherein said master latch comprises:

a second pass gate receiving said D input, a gate terminal of a PMOS transistor and a gate terminal of an NMOS transistor in said second pass gate being respectively coupled to said CKB signal and said CKZ signal; and a first inverter and a second inverter connected in series, an input of said first inverter being coupled to both of said feedback input and said D input.

4. The flip-flop of claim 3, wherein said master latch further comprises a third pass gate coupled between an output of said second inverter and an output of said second pass gate, a gate terminal of a PMOS transistor and a gate terminal of an NMOS transistor of said third pass gate being coupled to said CKZ signal and said CKB signal respectively.

5. The flip-flop of claim 3, wherein said slave latch comprises a fourth pass gate receiving an output generated by said second inverter, a gate terminal of a PMOS transistor and a gate terminal of an NMOS transistor of said fourth pass gate being coupled to said CKZ signal and said CKB signal respectively, an output of said fourth pass gate being provided as said feedback input to said master latch by said feedback circuit.

6. The invention of claim 5, wherein said flip-flop comprises a D-flip flop which passes said D input on a Q output at time points determined by said CLK signal when said ENZ signal indicates that said D flip-flop is not disabled.

7. The flip-flop of claim 6, wherein said output of said fourth pass gate comprises a QZ output representing a complement of said Q output, wherein said slave latch further comprises a third inverter performing a logical invertion operation on said output of said fourth pass gate to generate said Q output.

8. The flip-flop of claim 1, wherein said clock generation circuit controls said master latch and said slave latch such that said master latch and said slave latch do not have internal transitions due to clocking when said D input does not change in successive clocks of said CLK signal.

9. The flip-flop of claim 8, further comprising a scan data (SD) input and a scan mode input, wherein said flip-flop stores a bit received on said SD input when said scan mode indicates that said flip-flop is in scan mode irrespective of value of said ENZ input.

10. The flip-flop of claim 9, wherein said clock generation circuit comprises:

a fourth inverter performing a logical invertion operation on said scan mode input;

a XNOR gate performing a XNOR logical operation on a bit presently received on said D input and a bit received on a previous clock cycle of said CLK signal;

an OR gate receiving as inputs an output of said XNOR gate and said ENZ input;

a first NAND gate receiving an output of said OR gate and said fourth inverter; and a fifth inverter performing a logical invertion operation of an output generated by said first NAND gate, wherein said output of said first NAND gate represents said EN signal and an output of said fifth inverter represents said ENZZ signal.

11. The flip-flop of claim 10, wherein said clock generation circuit further comprises:

a second NAND gate performing a logical NAND operation of said EN signal and said CLK signal to generate said CKZ signal; and a sixth inverter performing a logical invertion operation of an output generated by said second NAND gate to generate said CKB signal.

12. The flip-flop of claim 9, wherein said clock generation circuit comprises:

a first PMOS transistor, a second PMOS transistor, a third PMOS transistor, a first NMOS transistor, a second NMOS transistor, and a third NMOS transistor, wherein source terminals of said first PMOS transistor and said third PMOS transistor are connected to a $V_{CC}$ voltage, wherein a drain terminal and a source terminal of said second PMOS transistor are respectively connected to a drain terminal of said first NMOS transistor and a drain terminal of said first PMOS transistor, wherein a drain terminal and a source terminal of said second NMOS transistor are respectively connected to a source terminal of said first NMOS transistor and a $V_{SS}$ voltage, wherein a drain terminal of said third NMOS transistor is connected to a drain terminal of both of said second PMOS transistor and said third PMOS transistor, and wherein a source terminal of said third NMOS transistor is connected to said source terminal of said first NMOS transistor.

13. The flip-flop of claim 9, further comprising a multiplexor-inverter, said multiplexor-inverter comprising:

a first PMOS transistor, a second PMOS transistor, a third PMOS transistor, a fourth PMOS transistor, a fifth PMOS transistor, a first NMOS transistor, a second NMOS transistor, a third NMOS transistor, a fourth NMOS transistor, and a fifth NMOS transistor, wherein a source terminal of said first PMOS transistor and said fourth PMOS transistor are connected to a $V_{CC}$ voltage, wherein a drain terminal and a source terminal of said second PMOS transistor are respectively connected to a source terminal of said third PMOS transistor and drain terminal of said first PMOS transistor, wherein a drain terminal and a source terminal of said first NMOS transistor are respectively connected to a drain terminal of said third PMOS transistor and drain terminal of said second NMOS transistor, wherein a drain terminal and a source terminal of said third NMOS transistor are respectively connected to a source terminal of said second NMOS transistor and a $V_{SS}$ voltage, wherein a drain terminal and a source terminal of said fifth PMOS transistor are respectively connected to a drain terminal of said fourth NMOS transistor and drain terminal of said fourth PMOS transistor, wherein a drain terminal and a source terminal of said fifth NMOS transistor are respectively connected to a source terminal of said fourth NMOS transistor and said $V_{SS}$ voltage, and wherein each of said drain terminals of said third PMOS transistor and said fifth PMOS transistor are connected to said drain terminals of both of said first NMOS transistor and said fourth NMOS transistor.

* * * * *